United States Patent [19]

Lagadec

[11] Patent Number: 4,780,892
[45] Date of Patent: Oct. 25, 1988

[54] SCANNING FREQUENCY SYNCHRONIZATION METHOD AND APPARATUS

[75] Inventor: Roger Lagadec, Rümlang, Switzerland

[73] Assignee: Willi Studer AG, Regensdorf, Switzerland

[21] Appl. No.: 774,005

[22] Filed: Sep. 9, 1985

[30] Foreign Application Priority Data

Oct. 5, 1984 [CH] Switzerland .................. 4787/84

[51] Int. Cl.$^4$ .................. H03L 7/00; H03K 5/22
[52] U.S. Cl. .................. 375/118; 375/108; 307/511; 328/55; 328/155
[58] Field of Search .............. 375/100, 108, 118, 119; 370/108; 307/511, 514, 526; 328/55, 155; 364/723, 853

[56] References Cited

U.S. PATENT DOCUMENTS

| 4,147,895 | 4/1979 | Fenoglio | 375/118 |
| 4,349,914 | 9/1982 | Evans | 375/100 |
| 4,429,386 | 1/1984 | Graden | 375/118 |
| 4,460,890 | 7/1984 | Busby | 364/723 |

Primary Examiner—Robert L. Griffin
Assistant Examiner—Andrew J. Telesz, Jr.
Attorney, Agent, or Firm—Werner W. Kleeman

[57] ABSTRACT

Using the inventive method and apparatus, two scanning sequences can be synchronized with small signal delays and at the smallest possible apparatus expense. The time differences between associated scanning values or signals of the two scanning sequences are compensated by alternatingly delaying relative to each other the scanned values or signals and interpolating between the scanned values or signals of one of the two scanning sequences. The apparatus for carrying out the synchronizing operation comprises a storage for producing the delays and a filtering device for performing the interpolation.

16 Claims, 5 Drawing Sheets

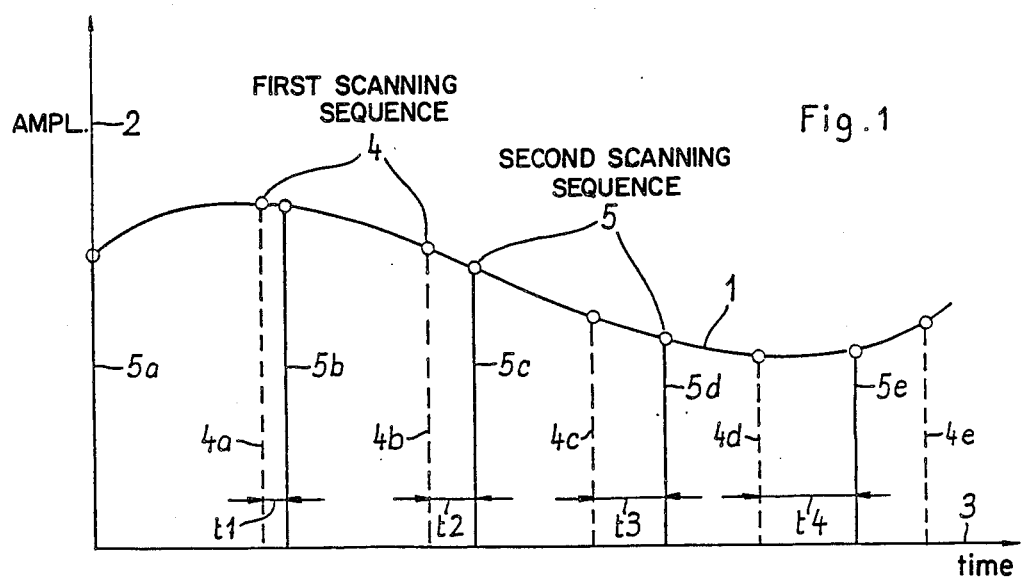
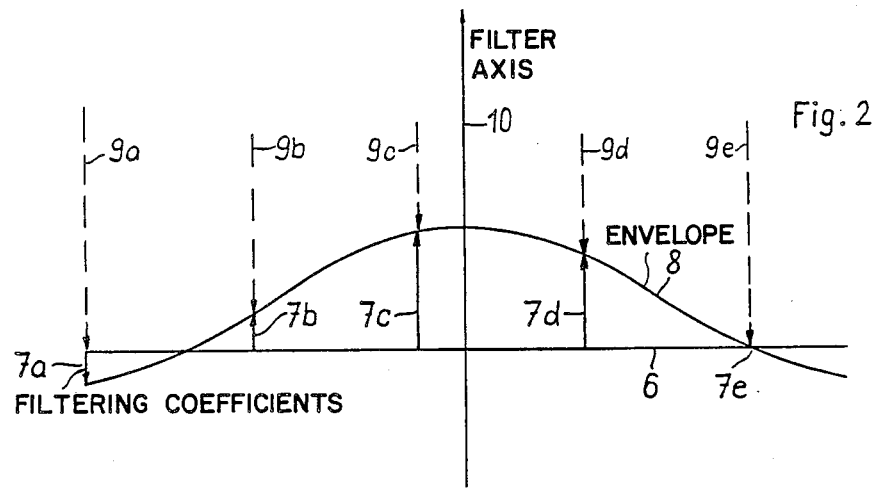

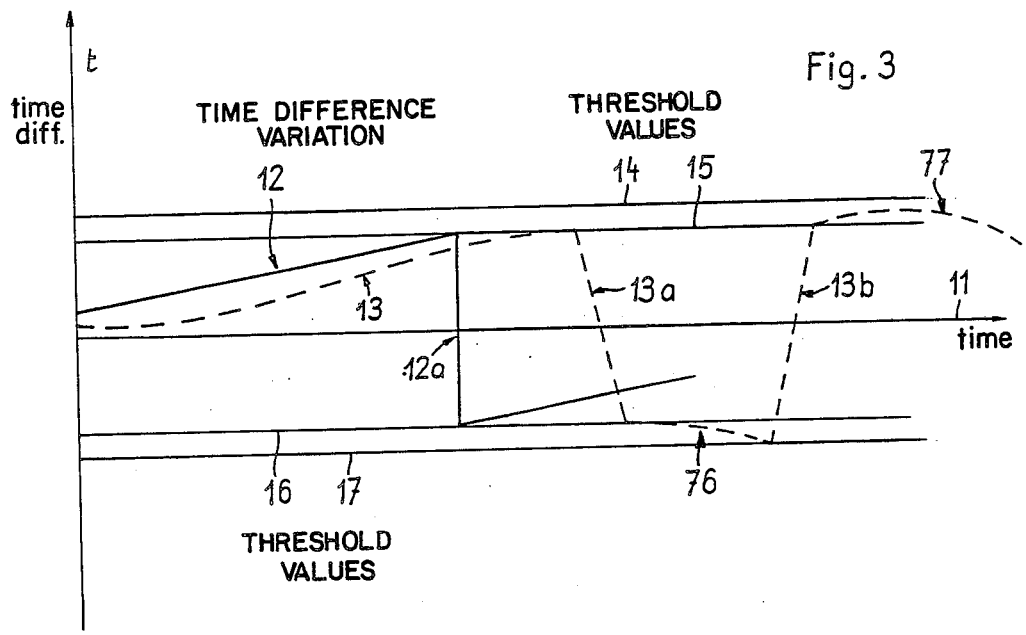
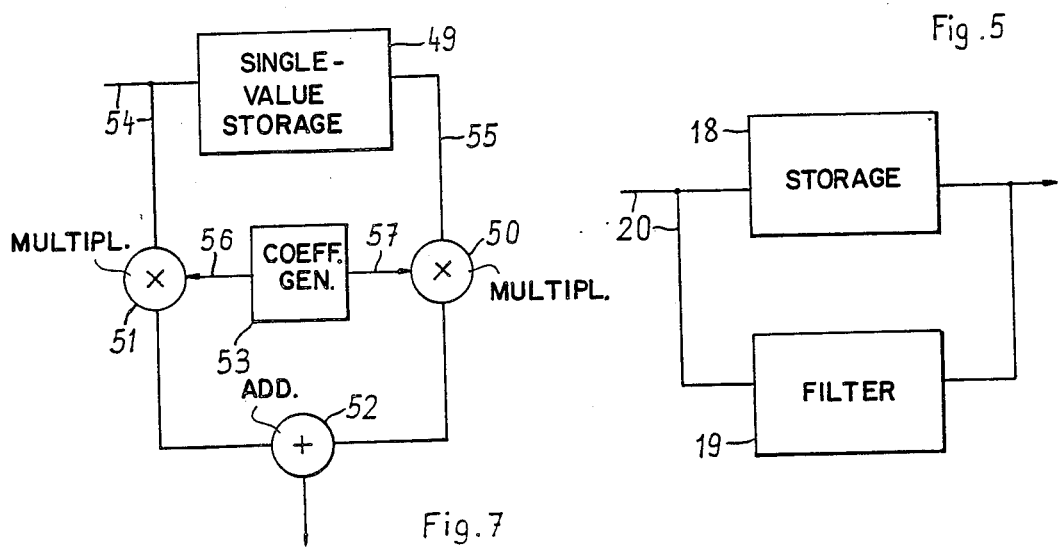

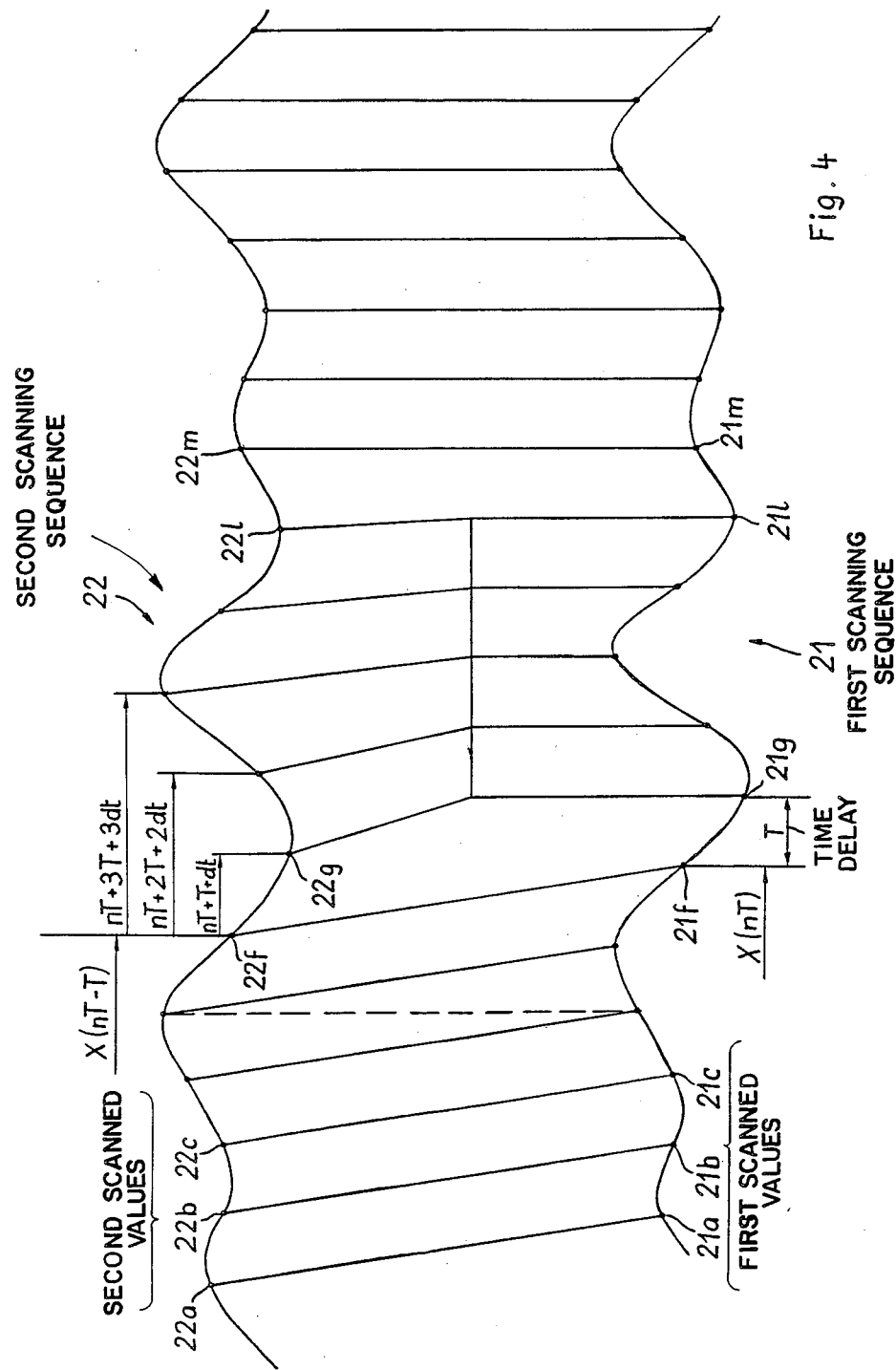

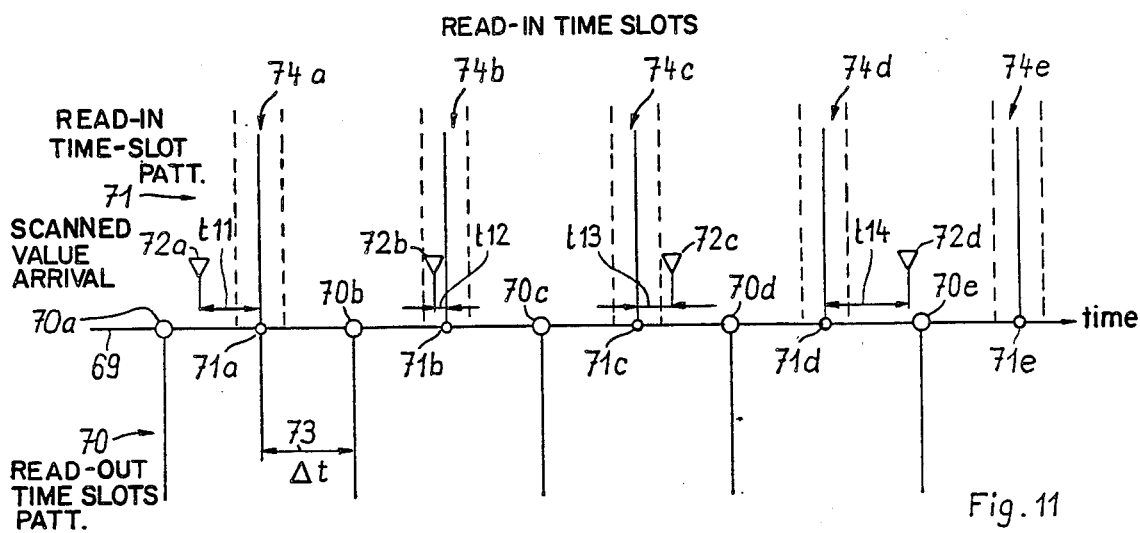
Fig. 11
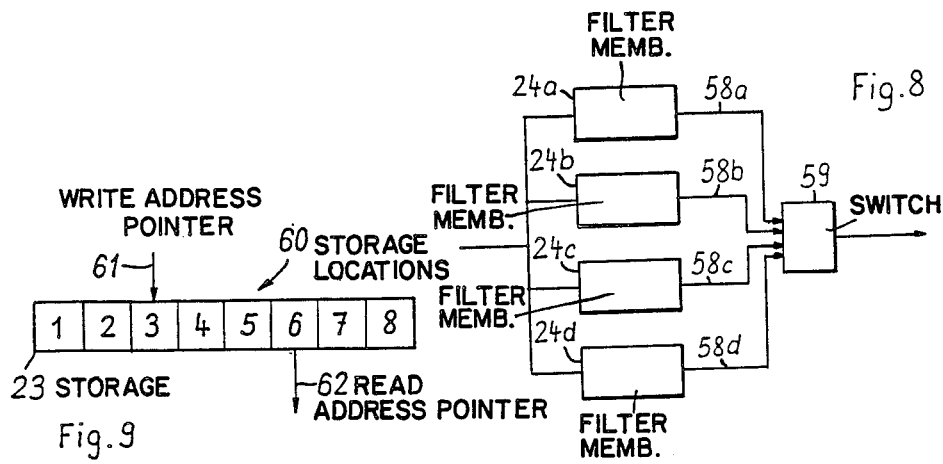
Fig. 8
Fig. 9
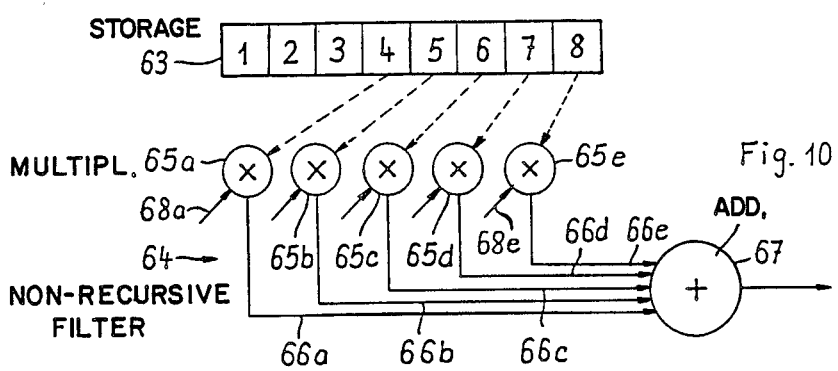
Fig. 10

SCANNING FREQUENCY SYNCHRONIZATION METHOD AND APPARATUS

CROSS-REFERENCE TO RELATED APPLICATION

This application is related to the commonly assigned copending U.S. application Ser. No. 774,006 filed Sept. 9, 1995, and entitled "Method and Apparatus for Producing and Selectively Equalizing a Temporal Relationship Between Series of Digital Signals", now granted as U.S. Pat. No. 4,709,278 on Nov. 24, 1987.

BACKGROUND OF THE INVENTION

The present invention relates to a new and improved method of, and apparatus for, deriving a first scanning sequence of first scanned values or signals which are required at a first scanning frequency, from a second scanning sequence of second scanned values or signals which arrive at a second scanning frequency.

The term "approximately synchronous audio systems" is used in the art with respect to two or more digitally operating audio systems employing scanning frequencies which coincide or approximately coincide over an extended time span. Conventionally such audio systems are controlled by means of clock signals. Such clock signals appear at frequencies constituting a multiple of the aforementioned scanning frequencies. Since the clock signals for two or more of such audio systems do not always originate from the same clock signal generator, the clock signals do not always appear at precisely the same moment of time in the two audio systems. As a consequence also the individual scanning sequences at the different scanning frequencies deviate from each other when considered during different time intervals and the individual scanned values or signals do not appear exactly at the same moments of time.

On the receiving side the data cannot be accepted at random moments of time within each scanning interval. Even more so, it must be avoided that data are read-in at moments of time at which they are also required on the receiving side. Therefore, there are frequently used systems which contain staggered buffer stores or which operate with multiple read-in cycles.

When the transmitters and receivers are not exactly synchronized, the slowly changing relative positions of the respective clock signal generators may have the consequence that, for example, a data item or word is lost or repeated in one audio system. For example, if two scanning frequencies having a rated value of 50 kHz deviate from each other by one millionth, one data item or word is lost or repeated every twenty seconds. Such errors are audible in digitally operating audio systems and, therefore, must be avoided. Clearly, such errors do not occur in cases in which all concerned audio systems are supplied or controlled by the same clock signal generator. In practice, however, such solution of the problem frequently is impracticable or too expensive.

The operation of combining approximately synchronous audio systems without an audible error is called "scanning frequency synchronization" in the art. Hitherto, substantially two methods for synchronizing scanning frequencies have become known.

A first solution of the problem was suggested under the title "Sampling Rate Synchronization by Variable Delay" in the BBC Research Report, RD 1979/17, September 1979. This solution consists of supplying one of, for example, two scanning sequences to storage means. During normal operation and corresponding to the so-called FIFO-principle (first in, first out), the first read-in scanned values or signals are also read-out again first. When, during a certain time interval, more scanned values or signals are read-in than read-out, this may result in a storage overflow. In order to prevent an overflow of the storage means, a portion of the storage content is not read-out or is passed-over. When, during a certain time interval, less scanned values or signals are read-in than read-out, predetermined standard scanned values or signals are added during the read-out operation. Both of the aforementioned operations are performed only at the occurrence of low-volume passages in the audio signal. In this manner this operation is not always audible.

A second solution to the problem is known, for example, from European Patent No. 0,052,847 granted July 7, 1985, and Eupean Patent Publication No. 0,137,323, published Apr. 17, 1985, and their cognate commonly assigned and co-pending U.S. patent application Ser. Nos. 06/674,633 and 06/678,776. According to this solution a scanning rate converter is used. By means of such scanning rate converters there can be transformed into each other and over a wide range, scanning sequences of different scanning frequencies.

It is a disadvantage of the first solution that the signal is delayed in the storage means. When a number of such devices are series-connected, this delay may become noticeable in an interfering manner. Furthermore, the appearance of such low-volume signals must be watched for in order to carry out the delay compensation between the scanning sequences. When the storage means is dimensioned too small, the appearance of the low-volume signals cannot be waited for and the correction becomes audible. When the storage means is dimensioned sufficiently large, the average signal delay is correspondingly greater. It must be added that, by using this apparatus, the regular sequence of the individual scanned values or signal is disturbed. This renders difficult the use of a time code or other accompanying data or information. It is, however, an advantage that the arriving signals are not subjected to quantization.

It is also the disadvantage of the second solution that the signal is delayed. In a series-connection of a number of scanning rate converters the noise which is caused by the quantization can appear in an interfering manner. Furthermore, the apparatus expense depending upon the construction, can be significant when such scanning rate converters are used.

SUMMARY OF THE INVENTION

Therefore, with the foregoing in mind it is a primary object of the present invention to provide an improved method of, and apparatus for, synchronizing a given scanning sequence and a predetermined scanning frequency in a simple manner and at the smallest possible signal delay.

Now in order to implement this and still further objects of the invention, which will become more readily apparent as the description proceeds, the method of the present development is manifested by the features that, time differences appearing between the first scanned values or signals of the first scanning sequence and the second scanned values or signals of the second scanning sequence are compensated by alternatingly delaying relative to each other the first scanned values or signals and the second scanned values or signals and interpolating between successive ones of the second scanned values or signals of the second scanning sequence.

As alluded to above, the present invention is not only concerned with the aforementioned method aspects, but also relates to an apparatus for deriving a first scanning sequence of first scanned values or signals which are required at a first scanning frequency, from a second scanning sequence of second scanned values or signals which arrive at a second scanning frequency.

Specifically, the inventive apparatus requires storage means receiving and storing at least one of the aforementioned scanned values or signals and filtering means for interpolating between successive ones of the aforementioned scanned values or signals.

It is one significant advantage achieved by the invention that two nominally equal scanning frequencies can be synchronized to a large extent without quantizing the individual scanned values or signals. Quantization occurs only during very short transitional periods during which a correction of the accumulated temporal deviations is performed between related scanning moments of time. The known quantization noise is thus eliminated to the largest extent. Furthermore, the occurring signal delays are very small. The apparatus for carrying out the inventive method can be realized in a very simple manner. This is particularly true when the most modern methods of digital signal processing are employed.

BRIEF DESCRIPTION OF THE DRAWINGS

The invention will be better understood and objects other than those set forth above, will become apparent when consideration is given to the following detailed description thereof. Such description makes reference to the annexed drawings, wherein:

FIG. 1 is a schematic illustration showing the variation of the amplitude of two different scanning sequences with time;

FIG. 2 is a schematic illustration of a set of filtering coefficients in filtering means employed in an exemplary embodiment of the inventive apparatus;

FIG. 3 is a schematic illustration of the time relation between two different scanning sequences;

FIG. 4 is an illustration showing two scanning sequences of scanned values or signals and explaining the inventive method;

FIG. 5 is a schematic block circuit diagram of the basic structure of the exemplary embodiment of the inventive apparatus for processing scanning sequences of the type as illustrated in FIG. 4;

FIG. 7 is a schematic block circuit diagram showing details of filtering means used in the apparatus illustrated in FIG. 6;

FIG. 8 is a schematic block circuit diagram showing details of different filtering means which can be used in the apparatus illustrated in FIG. 6;

FIG. 9 is a simplified block circuit diagram of the storage means used in the apparatus which is illustrated in FIG. 6;

FIG. 10 is a schematic block circuit diagram showing the relation between the storage means and the filtering means used in the inventive apparatus illustrated in FIG. 6; and FIG. 11 is a schematic diagram illustrating the time sequence of operations during the use of the inventive synchronizing method.

DETAILED DESCRIPTION OF THE PREFERRED EMBODIMENTS

Figure 6:
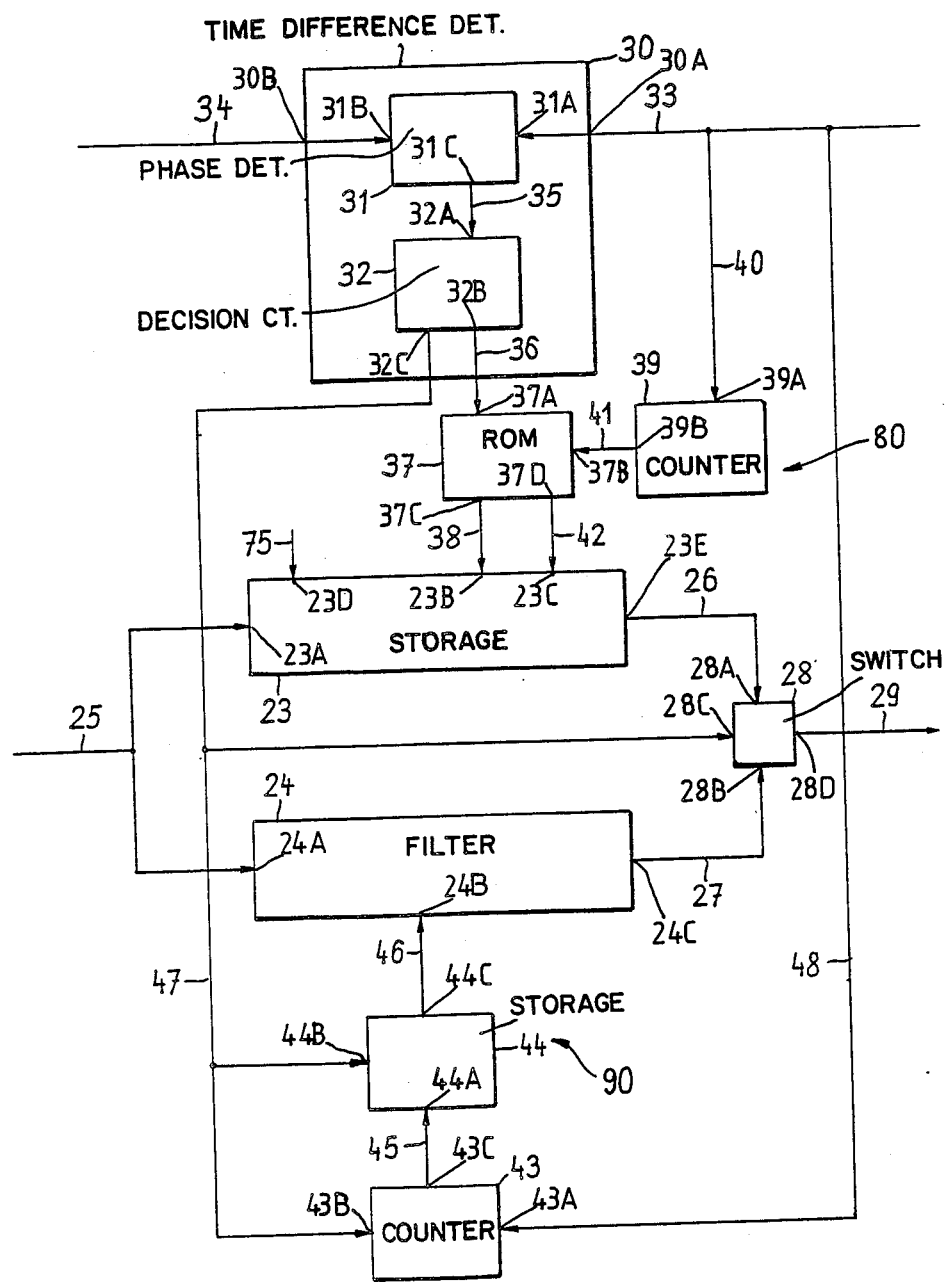
FIG. 6 is a detailed schematic block circuit diagram of the exemplary embodiment of the inventive apparatus.

Describing now the drawings, it is to be understood that only enough of the synchronizing method steps and of the synchronizing apparatus have been shown as needed for those skilled in the art to readily understand the underlying principles and concepts of the present development, while simplifying the showing of the drawings. Turning attention now specifically to FIG. 1, there has been schematically illustrated a signal 1, the amplitude of which is plotted along a vertical axis 2 and the variation of which with time is plotted along a horizontal axis 3. The signal 1 is assumed to be digitally scanned or sampled particularly by means of two different scanning sequences 4 and 5 at scanning or sampling frequencies which do not conform within the time span under consideration. The first scanning sequence 4 contains first scanned values or signals 4a, 4b, 4c, 4d, and 4e which are indicated by broken lines. The second scanning sequence 5 contains second scanned values or signals 5a, 5b, 5c, 5d, and 5e Time differences t1, t2, t3, and t4 can be seen to exist between the individual scanned values or signals 4a and 5b, 4b and 5c and so forth.

FIG. 2 shows in a schematic illustration filtering coefficients 7a, 7b, 7c, 7d, and 7e which are plotted on an axis 6 and which are applied in filtering means of an exemplary embodiment of the inventive synchronizing apparatus which will be described in more detail hereinafter. The value or amount of these filtering coefficients 7a to 7e is defined by the distance between the axis 6 and an envelope curve 8 at locations which are marked by the arrows 9a, 9b, 9c, 9d and 9e. The envelope curve 8 can be selected in such a manner as to extend symmetrically with respect to a filter axis 10.

FIG. 3 is a schematic illustration showing the variations 12 and 13 of the time differences mentioned hereinbefore with reference to FIG. 1 and plotted along a vertical time axis t and on a horizontal time axis 11. Along the horizontal time axis 11 there are plotted the time differences which exist between moments of time at which scanned values or signals of the scanning sequence 4 appear, and the moments of time at which scanned values or signals of the scanning sequence 5 appear. Limits which must not be exceeded, are set for the aforementioned time differences by the threshold values 14 and 17 as well as the threshold values 15 and 16. When the time difference approaches the eliminated or may even be transformed into a corresponding negative time difference. This is explained by the sections 12a, 13a and 13b.

FIG. 5 is a schematic block circuit diagram showing the basic structure of the exemplary embodiment of the inventive synchronizing apparatus. This structure comprises a parallel connection of a storage or storage means 18 and a filtering device or means 19 which alternatingly process scanned values or signals which arrive via a line or conductor 20.

FIG. 4 is a schematic diagram explaining the working of the inventive method. Specifically, there is shown a first scanning sequence 21 which is intended to be derived from a second scanning sequence 22. The individual first scanned values or signals of the first scanning sequence 21 are designated by the points 21a, 21b, 21c and so forth. The individual scanned values or signals of the second scanning sequence 22 are designated by the points 22a, 22b, 22c and so forth. Up to the point 22f, the second scanned values or signals of the second scanning sequence 22 lead the corresponding first scanned values or signals of the first scanning sequence 21, as will be readily apparent from inspection of FIG. 4, and which signal 21 is delayed by a duration approximately equal to one scanning interval T. This delay must be compensated for. The compensating operation is illustrated starting with the second scanned value or signal 22g and ending with the second scanned value or signal 22m. Following the second scanned value or signal 22l, the scanned values or signals of the two scanning sequences are in phase again.

Between the points 22f and 22m the scanned values or signals of the second scanning sequence 22 are separated from each other by time differences which do not correspond to one scanning interval T which existed between the arriving or incoming scanned values or signals. In fact, the amplitudes of the second scanned values or signals 22g to 22l constitute computed intermediate or interpolated values of the amplitude of the second scanning sequence 22 between the arriving scanned values or signals. This computation of intermediate or interpolated values is known, for example, from the publication by R. E. Crochiere, L. R. Rabiner, R. R. Shively, entitled "A Novel Implementation of Digital Phase Shifters", Bell System Technical Journal, Volume 54, 1975, pages 1497–1502.

A more detailed structure of the exemplary embodiment of the inventive synchronizing apparatus is illustrated as a block circuit diagram in FIG. 6. The primary elements in this apparatus are constituted by a storage or storage means 23 and a filter or filtering means 24. In this arrangement the storage or storage means 23 may also be considered to be a part of the filter or filtering means 24. Alternatively, the filter or filtering means 24 may operate without an inherent storage or storage means and directly uses the scanned values or signals which are just present in the storage or storage means 23. An input line 25 is connected to a first input 23A of the storage or storage means 23 as well as to a first input 24A of the filter or filtering means 24. The line 25 serves as an input line for supplying the scanned values or signals to be processed in the apparatus illustrated in FIG. 6. An output line 26 interconnects an output 23E of the storage or storage means 23 with a first input 28A of a switch or switching means 28. An output line 27 interconnects an output 24C of the filter or filtering means 24 and a second input 28B of the switch or switching means 28. An output 28D of the switch or switching means 28 is connected to an output line 29 of the entire apparatus.

The inventive apparatus further comprises a time difference detecting circuit 30 by means of which the time difference can be detected between associated first and second scanned values or signals. This time difference detecting circuit 30 substantially contains a phase detector 31 and a decision circuit 32. A line or conductor 33 is connected to a first input 30A of the time difference detecting circuit 30 and to a first input 31A of the phase detector 31. A line or conductor 34 is connected to a second input 30B of the time difference detecting circuit 30 and to a second input 31B of the phase detector 31. The two lines or conductors 33 and 34 supply related first and second clock signals to the phase detector 31 and these clock signals are proportional to the scanning frequencies of the first and second scanned values or signals. A line or conductor 35 interconnects an output 31C of the phase detector 31 and an input 32A of the decision circuit 32.

A first output 32B of the decision circuit 32 is connected to a first input 37A of a read-only memory or adding unit 37 by means of a line or conductor 36 leading to read-out means 80. A first output 37C of the read-only memory or adding unit 37 is connected via a line or conductor 38 to a second or write address pointer input 23B of the storage or storage means 23. A second output 37D of the read-only memory or adding unit 37 is connected via a line or conductor 42 to a third or read address pointer input 23C of the storage or storage means 23.

A line or conductor 41 interconnects a second input 37B of the read-only memory or adding unit 37 and an output 39B of a counter 39 of the read-out means 80. An input 39A of the counter 39 is connected to the line or conductor 33 via a line or conductor 40.

A further counter 43 and a further storage 44 of interpolating means 90 are series-connected to the filter or filtering means 24 which also consittute an element of the interpolating means 90. An output 43C of the counter 43 is connected by a line or conductor 45 with a first input 44A of the further storage 44 and an output 44C of the further storage 44 is connected by means of a line or conductor 46 with a second input 24B of the filter or filtering means 24. A first input 43B of the counter 43 and a second input 44B of the further storage 44 are connected by means of a line or conductor 47 to a second output 32C of the decision circuit 32 in the time difference detecting circuit 30. The line or conductor 47 is also connected to a third input 28C of the switch or switching means 28. A second input 43A of the counter 43 is connected to the line or conductor 33 by means of a line or conductor 48.

The phase detector 31 as well as the decision circuit 32 are components which are known per se and which, therefore, are not illustrated in any greater detail. Such phase detectors 31 are well-known in many fields of digital signal processing. By means of the phase detector 31 there is only measured the phase difference or time difference between the clock signals of the two clock signal sequences which arrive via the lines or conductors 33 and 34. This phase or time difference is converted into an output signal which may be designated by k. The decision circuit 32 is programmed in such a manner that an output signal is generated at the second output 32C and thus on the line or conductor 47 when the k-values reach the predetermined threshold values 14 to 17 mentioned hereinbefore with reference to FIG. 3. For this purpose the decision circuit 32 stores a number of preceding k-values and thus is enabled to deliver an output signal when the k-values approach one of the predetermined threshold values 14 to 17.

The read-only memory or adding unit 37 as well as the counter 39 are likewise known electronic components and this is also true for the switch or switching means 28.

As the storage or storage means 23 there can be used known random-access-memories, whereas the further storage 44 only supplies read-in constant values which in the present case constitute storage addresses for filtering coefficients. For this reason, the further storage 44 is designed as a read-only memory. The counter 43 also can be a commercially available component.

The construction of the filter or filtering means 24 will be explained further hereinbelow.

FIG. 7 is a schematic block circuit diagram showing a particularly simple construction of the filter or filtering means 24 designed for linear interpolation. As the storage or storage means there is used a single-value storage 49 which thus is only suited to store a single scanned valu or signal. The filter or filtering means illustrated in FIG. 7 further comprises multipliers 50 and 51 which are arranged in known manner, an adding unit 52 as well as a coefficient generator 53. The single-value storage 49 is connected on its input side via the multiplier 51 with the adding unit 52 by means of a line or conductor 54. The single-value storage 49 is also connected on its output side with the adding unit 52 via the multiplier 50 and by means of a line or conductor 55. The coefficient generator 53 is connected with the multipliers 50 and 51 by means of related lines or conductors 56 and 57. However, this is only one possible construction of a filter or filtering means which can perform an interpolation, i.e. a continuous combining or mixing or fade-over operation between the amplitude valves of two sucessive input signals which only differ by their relative time delay.

According to FIG. 8 the filter or filtering means 24 shown in FIG. 6 may be subdivided into filter units or members 24a, 24b, 24c and 24d. This subdivision of an interpolation filter into filter members is well-known from the literature concerning signal processing and is designated as poly-phase structure see, for example, the publication by M. G. Bellanger et al, entitled "Digital Filtering by Polyphase Network: Application to Sample-Rate Alteration and Filter Banks" in IEEE Transactions on Acoustics, Speech, and Signal Processing, Vol. ASSP-24, No. 2, April 1976, pages 109 to 114. Lines or conductors 58a, 58b, 58c and 58d connect the filter members 24a to 24d and a switch 59.

FIG. 9 shows in a highly simplified illustration that the storage or storage means 23 shown in FIG. 6 may be structured for storing, for example, eight scanned values or signals and contains storage locations 60 numbered 1 to 8. The write address pointer 61 is assumed to be adjusted such that incoming scanned values or signals are read-in into storage locations 3, 4, 5, 6 . . . The read address pointer 62 therein is assumed to be adjusted such that the scanned values or signals are read-out from the storage location 6, 7, 8, 1, . . . , i.e. are read-out at an offset and at a delay defined by a number of storage locations.

FIG. 10 shows in a schematic illustration the relation which may exist between a storage or storage means 63 and a non-recursive filter 64. The filter 64 contains a number of multiplier units 65a to 65e which are connected to an adding circuit 67 by related lines or conductors 66a to 66e. The multiplier units 65a to 65e are also respectively connected to the individual storage locations 1 to 8 of the storage or storage means 63, namely in such a manner that scanned values or signals can be supplied from each storage location to each respective multiplier unit 65a to 65e. The storage or storage means 63 can be considered as the storage or storage means illustrated in FIG. 6. The storage or storage means 63 may also constitute a storage which is associated with the non-recursive filter 64 which may be considered an embodiment of the filter or filtering means 24 of the apparatus illustrated in FIG. 6 and which receives the same scanned values or signals as the independent storage or storage means 23. Inputs 68a to 68e of the multiplier units 65a to 65e serve to supply filtering coefficients to the individual multiplier units 65a to 65e.

FIG. 11 shows the time dependence of the operations during the read-in and read-out of the scanned values or signals into or from the storage or storage means 23 or the corresponding storage incorporated in the filter or filtering means 24. The points 70a to 70e of a read-out time sequence or time-slot pattern 70 are plotted on a time axis 69. This time-slot pattern 70 determines the moments of time at which scanned values or signals are read-out. Points 71a to 71e form a read-in time sequence or time-slot pattern 71. This time-slot pattern 71 determines the moments of time at which scanned values or signals are read-in into the storage or storage means 23.

The read-out time sequence or time-slot pattern 70 is synchronized with the output scanning frequency. The read-in time sequence or time-slot pattern 71 is synchronized with the read-out time sequence or time-slot pattern 70, however, can be shifted in relation thereto in terms of phase. The reference numerals 72a to 72d indicate the moments of time at which the scanned values or signals arrive at the storage or storage means 23. The just-mentioned phase shift is indicated by the distance 73. This distance 73 is due to the construction of the storage or storage means 23, however, may be very small. The first and second scanning sequences 22 and 21 in FIG. 4 have been drawn under the assumption that this distance 73 is very small. The points 71a to 71e of the read-in time-slot pattern 71, furthermore, are surrounded by related regions 74a to 74e, each of which is bounded by broken lines. These broken lines correspond to the threshold values 14 to 17 shown in FIG. 4.

It is a principle of the inventive scanning frequency synchronization (meaning synchronization of scanned values or signals of different scanning sequences which can be scanned at different frequencies) that each phase shift or time difference t1, t2, t3, t4 and so forth, as illustrated in FIG. 1, which has been determined between associated scanned values or signals of the two scanning sequences 4 and 5, is accounted for in such a manner that there is ensured the transmission of a signal which is free of discontinuities. When a reliable operation is ensured due to the phase relation between the incoming data and their transmission, the apparatus merely operates in the manner of a FIFO-storage. When the phase shift or time difference increases close to the scanning interval, the delay is compensated by a continuous decrease of the time difference which is effected by processing the related scanned values or signals. This processing method which is called interpolation, operates in such a manner that intermediate scanned amplitude values or signals related first scanned valves or signals 4a, 4b, 4c, 4d and so forth of the first scanning sequence 4 are computed during a transitional range or during a transitional time period from the second scanned amplitude values or signals 5b, 5c, 5d, 5e and so forth of the second scanning sequence 5. As illustrated in FIG. 4, this transitional range is located between the scanned amplitude values or signals 22f and 22m or 21f and 21m. Prior to and following this transitional region there exists a stationary state.

The inventive apparatus exclusively operates in the stationary or steady state, for example, when it is intended to synchronize two scanning sequences of nominally equal scanning frequencies and when the scanned values or signals of the two scanning sequences deviate from each other by less than one scanning interval considering even very small time intervals. In this case the distance 73 between the read-in time sequence or time-slot pattern 71 and the read-out time sequence or time-slot pattern 70 illustrated in FIG. 11 may be selected to be a minimum. During this operation scanned values or signals are neither eliminated nor read-out twice.

When the scanning frequencies of the two scanning sequences which are to be synchronized, deviate from each other to a greater extent it may occur that associated scanned values or signals of the two scanning sequences appear at a distance which is greater than one scanning interval. It may also occur that the time difference continuously increases between the associated scanned values or signals. In such case the accumulated error in time has to be compensated for by means of the filter or filtering means 24. During this time the storage or storage means 23 is returned to an orderly storage of scanned values or signals which means that the consequences of preceding index collisions become ineffective.

In the stationary state the first clock signal is supplied to the phase detector 31 via the line or conductor 33. This first clock signal is in synchronism with a desired output scanning sequence. For example, this first clock signal may be in synchronism with the first scanning sequence 4 in FIG. 1 or the first scanning sequence 21 of FIG. 4 and determines the read-out time sequence or time-slot pattern 70, see FIG. 11, for the storage or storage means 23 via a line 75 connected to a fourth input 23D of the storage or storage means 23. The read-in time sequence or time-slot pattern 71 is also established thereby. The distance 73 is still selectable.

The second clock signal is supplied to the phase detector 31 via the line or conductor 34. This second clock signal is synchronized with the second scanned values or signals which, for example, are associated with the second scanning sequence 5 of FIG. 1 or the second scanning sequence 22 of FIG. 4. For the following consideration it will be assumed that this second clock signal is synchronized with the times 72a to 72d in FIG. 11.

In correspondence with the associated time differences t11, t12 and so forth the phase detector 31 supplies the signal k via the line 35 to the decision circuit 32. In this decision circuit 32 a number of successive k-values are stored. In the present case or stationary or steady state in the operation it can be assumed that the time differences t11, t12 and so forth never become zero and never exceed one scanning interval. Simultaneously, the counter 39 continuously receives clock signals from the line or conductor 33 via the line or conductor 40. When, for example, the storage or storage means 23 contains eight storage locations or places, the counter 39 continuously counts from 1 to 8 in synchronism with the read-out time sequence or time-slot pattern 70 and transmits this count via the line or conductor 41 to the read-only memory or adding unit 37. This read-only addresses for writing-in the scanned values or signals into, the storage or storage means 23. The read-only memory or adding unit 37 supplies via the line 42 read addresses for reading-out in time the scanned values or signals from the storage or storage means 23. In this manner the time differences t11, t12 and so forth are comensated or equalized.

When the time differences t11, t12 and so forth exceed one scanning interval or continuously change in the same direction for a longer period of time, the scanned values or signals are subjected to what is exemplarily illustrated at the time 72b in FIG. 11. The scanned value which arrives at the storage or storage means 23 at the moment of time 72b, is located within the limiting range 74b, that is so close to a moment of time 71b at which the scanned values or signals are read-in, that it is possible that this value is not read-in at the moment of time 71b. Such a case is detected by the decision circuit 32 and causes this decision circuit 32 to transmit a signal to lines or conductors 36 and 47. As a reaction thereto the read-only memory or adding unit 37 interrupts the read-in and read-out operation of storage addresses.

As a reaction to the aforementioned signal transmitted by the decision circuit 32 there is also operated the switch or switching means 28 which means that now the lines or conductors 27 and 29 are interconnected. Furthermore, the counter 43 starts to count from 0 to M. This counting operation is performed in synchronism with the clock signal from line or conductor 33 which is supplied to the second input 43A of the counter 43. The number M is a predetermined number and indicates the number of output scanning intervals T during which a combining, mixing or fading-over operation, i.e. an interpolation is performed with the incoming scanned amplitude values or signals. Based on the values M which are supplied via line or conductor 45 to the further storage 44, this further storage 44 supplies pre-stored filtering coefficients via line or conductor 46 to the filter or filtering means 24. Considering FIGS. 2 and 11, this means that the filter axis 10 is aligned to M successive moments of time 70c, 70d, 70e and so forth. The time differences t1, t2, t3, t4, see FIG. 1, or t11, t12, t13, t14, see FIG. 11, which have been determined and which are supplied to the further storage 44 via line 47, permit the further storage 44 to determine, for example, four or five filtering coefficients 7a, 7b, 7c, 7d, and 7e for determining one output scanned value or signal 5c. This operation is repeated for the M scanned values or signals 22g to 22l shown in FIG. 4 and this operation is generally designated as a combination or mixing or fade-over operation and more specifically as an interpolation-type filtering operation. For this operation it must be considered that, as will be evident from FIG. 1, preceding and successive scanned values or signals are also used for the filtering operation. As a consequence, the individual scanned values or signals pass through a storage or storage means 23 or 63 and remain stored therein for a number of scanning periods. This will be particularly evident from FIGS. 9 and 10.

With reference to FIG. 10 the filtering operation can now be described more precisely. If, for example, the scanned amplitude value or signal which is stored at the storage location 6 and which, for example, is the second scanned value or signal 5b in FIG. 1, is intended to be transformed into an associated first scanned amplitude value or signal 4b, the scanned values or signals stored at the storage locations 4, 5, 6, 7, 8 are read-in into the multiplier units 65a to 65e. The scanned values or signals are multiplied in the multiplier units 65a to 65e by the filtering coefficients 7a to 7e and are supplied to the adding unit or circuit 67 via the lines 66a to 66e. This is repeated for each one of the output scanned values or signals.

After the interpolation of the M scanned values or signals, the switch or switching means 28 is re-switched so that the stationary or steady state is re-formed. In order to avoid immediately successive interpolations, there are input, for example, four threshold values 14 to 17 into the decision circuit 32. Subsequently to a combination, mixing or fade-over operation or interpolation and to the sections 12a, 13a, 13b as illustrated in FIG. 3, there is not intended to immediately follow a further combination, mixing or fade-over operation which might be caused by the sections 76 and 77. For this reason the threshold values 14 and 17 are set further apart. Due to the combination, mixing or fade-over operation or interpolation the scanned values or signals of the input scanning sequence are positively or negatively delayed relative to the output scanning sequence and there thus results a new output condition allowing for a further delay. This results in a hysteresis phenomenon.

It is evident from FIG. 4 that this combination, mixing or fade-over operation can be effected very smoothly. The second scanned amplitude values or signals 22a to 22f lead by one scanning period T relative to the first scanned values or signals 21a to 21f. This is intended to be corrected, namely in steps of dt. This operation is governed by the relation T=M.dt. The second scanned amplitude value or signal 22f appears at the moment of time (nT−T). The first scanned value or signal 21f is a function of the time (nT). The computed, i.e. interpolated second scanned amplitude values or signals 22g to 22l, correspondingly, appear at the times:

(nT+T+dt)

(nT+2T+2dt)

(nT+3T+3dt)

(nT+4T+4dt)

(nT+5%+5dt), and (nT+6T+6dt).

Beginning with scanned values or signals 21l and 22l (see FIG. 4), the scanned values or signals of the two scanning sequences 21 and 22 again correspond to integral multiples of T. Prior to and after the scanned values or signals 22g and 22l the individual scanned values or signals are not quantized as required during the filtering operation.

When the input scanned values or signals appear at moments of time within the regions 74a to 74e shown in FIG. 11, it may be advantageous to shift the read-in time sequence or time-slot pattern 71 relative to the read-out time sequence or time-slot pattern 70. Such a phase shift changes the distance 73 and is particularly persuasive when a number of successive scanned values or signals appear at the aforementioned moments of time. In order that no scanned values or signals may be lost or read-out twice during such phase shift, an interpolation must be carried out. This is initiated by the phase detector 31 which continuouslymmonitors the phase relation between the input scanning frequency and the output scanning frequency.

The most simple filter which can be used, is an interpolator of the type as illustrated in FIG. 7. In a first state thereof, the interpolator acts as a delay circuit which delays by one scanning interval the scanned values or signals which arrive via the line 54. No quantization occurs during this operation. For this purpose the coefficient generator 53 supplies the value "1" to the multiplier 50 via the line or conductor 57 and the value "0" to the muttiplier 51 via the line or conductor 56. In order to decrease the delay, for example, by one scanning interval T, the values supplied by the coefficient generator 53 are varied in steps between 1 and 0, on the one hand, and 0 and 1, on the other hand, during a transition phase, that is during the combination, mixing or fade-over operation, i.e. the interpolation. Such a filter is suitable for processing audio signals only at relatively moderate signal quality requirements.

With reference to FIG. 4 of the drawings, the second scanned amplitude values 22a, 22b, 22c etc. of the second scanning sequence 22 lead the associated first scanned amplitude values or signals 21a, 21b, 21c etc. of the first scanning sequence 21 by one scanning period T. In accordance with the foregoing description of the assumed six step interpolation described with reference to FIG. 4, it is intended to eliminate such lead of the second scanning sequence 22 during six interpolation intervals such that the seventh second scanning amplitude value of signal 22m is finally delayed by one scanning period T and thus appears in synchronism with the first scanned amplitude value or signal 21m of the first scanning sequence 21, again as evident from FIG. 4. The interpolating operation thus is carried out, for instance, in six equal steps beginning with the second scanned amplitude value or signal 22f and ending with the seventh second scanned amplitude value or signal 22m.

As explained hereinbefore, during the first step of this operation and in the first state of the filter or interpolator shown in FIG. 7, the second scanned amplitude value 22f is obtained when the first next-following amplitude value appears at the input side of the storage 49 at the time corresponding to nT+T. The multiplier 50 receives the second scanned amplitude value 22f which is now outfed from the storage 49, and the coefficient generator 53 provides the coefficeint 1 at the multiplier 50 and the coefficeint 0 at the multiplier 51. The adder 52 thus produces the second scanned amplitude value 22f as the amplitude value which was stored in the storage 49 prior to the arrival of the aforementioned first next-following amplitude value appearing at the time nT+T.

During the next step of the interpolation, the second next-following amplitude appearing at the time nT+2T displaces the first next-following value which appeared at the time nT+T from the storage 49 and is now stroed therein and applied to the multiplier 51. The first next-following amplitude value which appeared at the time nT+T is applied to the multiplier 50. The coefficient generator 53 delivers the coefficients 5/6=0.833 to the multiplier 50 and 1/6=0.166 to the multiplier 51. The adder 52 thus forms the sum of 5/6 of the first next-following amplitude value which appeared at the time nT=T and 1/6 of the second next-following value which appeared at the time nT+2T. This operation essentially constitutes an interpolation between the aforedescribed first and second next-following amplitude values appearing in FIG. 4 and yields an amplitude value which is associated with the moment of time nT+T+dt after the second scanned amplitude value 22f. This interpolated amplitude value constitutes the second scanned amplitude value or signal 22g in FIG. 4.

In analogous manner further interpolation steps are successively carried out with the next-following amplitude values which respectively appear at the times nT+3T, nT+4T, nT+5T, and nT+6T. For instance, the interpolated amplitude value constituting the second scanned amplitude value or signal 22l is obtained by interpolating between the fifth and sixth next-following amplitude values respectively appearing at the times nT+5T and nT+6T after the second scanned amplitude value 22f and while using the respective coeffients 5/6=0.833 and 1/6=0.166 at the multipliers 51 and 50. Finally, the seventh next-following amplitude value appears at 6 (T+dt)=6T+6dt, i.e. 7T and thus at a delay of one scanning period T and, therefore, constitutes the second scanned amplitude value or signal 22m which appears at the same time or in synchronism with the associated first scanned amplitude value or signal 21m of the first scanning sequence 21.

Especially suited for carrying out the inventive method are filters of the type as used in the known scanning rate converters of the type as known from the initially mentined European Patent No. 0,052,847 and European Patent Publication No. 0,137,323 as well as European Patent Publication Nos. 0,099,600, published Feb. 1, 1984, and 0,151,829 published Aug. 21, 1985. These special filters constitute higher-order interpolators. In carrying out the inventive method, a time resolution of corresponding quality is not necessary which permits the use of highly simplified constructions of such special filters or higher-order interpolators. When the aforementioned higher-order interpolators are provided as such special filters, they can be designed as FIR filters having a low-pass characteristic. Such FIR filter may be considered a poly-phase filter subdivided into filter units or members 24a, 24b, 24c and so forth, each of which is enabled to perform a fractional delay which amounts to a fraction of the scanning interval.

The operating frequency of such special filters or higher-order interpolators results from the product of the scanning frequency and the aforementioned number M of the fractional steps in a combining, mixing or fade-over, i.e. interpolating operation. The number of multiplications to be performed by such a special filter or higher-order interpolator during each scanning interval is given by the quotient of the filter length and the number M. An example is constituted by a filter containing four multipliers, having a filter length of 128 and intended for a transition range of the filter length and which corresponds to 32 scanning intervals. This special filter results in a delay of four scanning intervals. During the combining, mixing or fade-over operation the signal has a modest amplitude error at high audio frequencies in a suitable synthesis by means of the filter. For example, there results an attenuation of only 1dB at 15 kHz and at a scanning frequency of 48 kHz. The quantization noise, under the condition that the filter operates using 16-bit signals, amounts to −98dB. However, all such detrimental effects only occur very rarely, typically once after a number of seconds, and can have very short durations. For example, during a 32-stage combination, mixing or fade-over operation and at a scanning frequency of 48 kHz the detrimental effects have a duration of 0.667 milliseconds.

While there are shown and described present preferred embodiments of the invention, it is to be distinctly understood that the invention is not limited thereto, but may be otherwise variously embodied and practiced within the scope of the following claims.
ACCORDINGLY,

What I claim is:

1. A method of maintaining a predetermined time relationship between a first scanning sequence of first scanned values at a first scanning frequency and a second scanning sequence of second scanned values at a second scanning frequency, said method comprising the steps of:

monitoring time differences between said first scanned values of said first scanning sequence and associated ones of said second scanned values of said second scanning sequence; and limiting said time differences, which exist between said frist scanned values and said associated second scanned values, to a predetermined time difference by utilizing the alternate steps of (i) maintaining a predetermined delay time below said predetermined time difference between said first scanned balues and said associated second scanned values and (ii) interpolating between the amplitudes of a predetermined number of successive ones of said second values of said second scanning sequence in the event that said monitored time difference increases to said predetermined time difference.

2. The method as defined in claim 1, wherein:
   said step of interpolating between said amplitudes of said predetermined number of successive second scanned values intails the step of reducing a delay between individual associated ones of said second scanned values and said first scanned values and thereby limiting said time difference, which exists between said individual associated second scanned values and said first scanned values, to said predetermined time difference.

3. The method as difined in claim 1, wherein:
   said step of interpolating between said amplitude of said predetermined number of successive second scanned values entails the step of increasing a delay between individual associated ones of said second scanned values and said first scanned values and thereby limiting said time difference, which exists between said individual associated second scanned values and said first scanned values, to said predetermined time difference.

4. A method of maintaining a predetermined time relationship between a first scanning sequence of first scanned values at a first scanning frequency and a second scanning sequence of second scanned values at a second scanning frequency, said method comprising the steps of:

reducing time differences between said first scanned values of said first scanning sequence and associated ones of said second scanned values of said seocnd scanning sequence;

said step of reducing said time differences entails the alternate steps of (i) maintaining a predetermined delay time between said frist scanned values and said associated second scanned values and (ii) interpolating between the amplitudes of a predetermined number of successive ones of said second scanned values of said second scanning sequence;

providing at least one threshold value for said time differences; and initiating said step of interpolating between said predetermined number of successive ones of said second scanned values, when said at least one threshold value for said time differences is reached.

5. A method of maintaining a predetermined time relationship between a first scanning sequence of first scanned values at a first scanning frequency and a second scanning sequence of second scanned values at a second scanning frequency, said method comprising the steps of:

reducing time differences between said first scanned values of said first scanning sequence and associated ones of said second scanned values of said second scanning sequence;

said step of reducing said time differences entails the alternate steps of (i) maintaining a predetermined delay time between said first scanned values and said associated second scanned values and (ii) interpolating between the amplitudes of a predetermined number of successive ones of said second scanned values of said second scanning sequence;

defining a read-in time sequence for reading-in said second scanned values into storage means;

defining a read-out time sequence for reading-out said stored second scanned values from said storage means in order to produce said first scanned values;

providing a predetermined phase shift between said read-in time sequence and said read-out time sequence in order to produce said first scanned values at said predetermined delay time relative to said associated second scanned values; and using said step of interpolating between said amplitudes of said predetermined number of successive second scanned values of said second scanning sequence in order to maintain said predetermined phase shift between said read-in time sequence and said read-out time sequence.

6. The method as defined in claim 5 wherein:

said step of using the interpolation between said amplitudes of said predetermined number of successive second scanned values for maintaining said predetermined phase shift entales the step of shifting said read-in time sequence relative to said read-out time sequence from said predetermined phase shift provided between said read-in time sequence relative to said read-out time sequence from said predetermined phase shift provided between said read-in time sequence and said read-out time sequence in order to adapt said read-in time seuqence to said second scanning frequency associated with said second scanned values.

7. The method as defined in claim 6, wherein:

said step of shifting said read-in time sequence relative to said read-out time sequence includes said step of interpolating between said amplitudes of said predetermined number of successive second scanned values of said second scanning sequence such that there is ensured the absence of any discontinuity in the processing of said second scanned signals and in the produced first scanned signals.

8. A method of synchronizing two sequences of scanned signals, comprising the steps of:

generating a first scanning sequence of first scanned signals;

generating a second scanning sequence of second scanned signals;

producing from said second scanning sequence of said second scanned signals, a further scanning sequence of further scanned signals;

determining time differences between said first scanned signals and said second scanned signals; and said step of producing from said second scanning sequence of said second scanned signals, said further scanning sequence of said further scanned signals, entailing the step of equalizing said time differences between said first scanned signals and said second scanned signals by employing the alternate steps of (i) delaying relative to each other said first scanned signals and said second scanned signals and (ii) interpolating between the amplitudes of successive ones of said second scanned signals in order to thereby synchronize said first scanning sequence of first scanned signals and said further scanning sequence of said futher scanned signals.

9. An apparatus for maintaining a predetermined time relationship between a first scanning sequence of first scanned values at a frist scanning frequency and a second scanning sequence of associated second scanned values at a second scanning frequency, said apparatus comprising:

storage means;

said storage means receiving and storing a predetermined number of said second scanned values;

interpolating means for interpolating between amplitudes of successive ones of said predetermined number of said second scanned values;

said interpolating means being connected in parallel with said storage means;

read-out means operatively associated with said storage means; and said read-out means and said interpolating means alternately cooperating with said storage means for limiting a time difference between said first scanned values and said associated second scanned values to a predetermined time difference by alternately (i) maintaining below said predetermined time difference a predetermined time delay between said frist scanned values and said associated second scanned values and (ii) interpolating between the amplitudes of said predetermined number of successive ones of said associated second scanned values in the event that said time difference increases to said predetermined time difference.

10. The apparatus as deifned in claim 9, further including:

switching means assocaited with said storage means and said interpolating means;

a time difference detection circuit monitoring the time difference existing between said first scanned values and said associated second scanned values;

said switching means being operatively connected to said time difference detection circuit; and said switching means, in response to a signal issuing from said time difference detection circuit and indicating a time difference increased to said predetermined time difference, switching to said interpolating means in order to start said alternate interpolating operation.

11. An apparatus for maintaining a predetermined time relationship between a first scanning sequence of first scanned values at a first scanning frequency and a second scanning sequence of associated second scanned values at a second scanning frequency, said apparatus comprising:

storage means;

said storage means receiving and storing a predetermined number of said second scanned values;

interpolating means for interpolating between the amplitudes of successive ones of said predetermined number of said second scanned values;

read-out means operatively associated with said storage means;

said read-out means and said interpolating means respectively cooperating with said storage means such as to alternaltey (i) maintain a predetermined time delay between said first scanned values and associated ones of said second scanned values and (ii) interpolate between the amplitudes of said predetermined number of successive ones of said associated second scanned values, and thereby maintaining said predetermined time relationship between said first scanning sequence of first scanned values and said second scanning sequence of second scanned values;

switching means associated with said storage means and said interpolating means;

said switching means switching between said storage means and said interpolating means during processing of said second scanned values for producing said first scanned values;

a time-difference detecting circuit;

said time-difference detecting circuit being repsonsive to the time difference existing between said first scanned values of said first scanning sequence and said associated second scanned values of said second scanning sequence;

said time-difference detecting circuit containing a first input for receiving signals indicative of said first scanning frequency; and said time-difference detecting circuit containing a second input for receiving signals indicative of said second scanning frequency.

12. The apparatus as defined in claim 11, wherein: said time-difference detecting circuit comprises a phase detector and a decision circuit.

13. An apparatus for maintaining a predetermined time relationship between a first scanning sequence of first scanned values at a first scanning frequency and a second scanning sequence of associated second scanned values at a second scanning frequency, said apparatus comprising:

storage means;

said storage means receiving and storing a predetermined number of said second values;

interpolating means for interpolating between amplitudes of successive ones of said predetermined number of said second scanned values;

read-out means and said interpolating means operatively associated with said storage means;

said read-out means and said interpolating means respectively cooperating with said storage means such as to alternately (i) maintain a predetermined time delay between said first scanned values and said associated second scanned values and (ii) interpolate between the amplitudes of said predetermined number of successive ones of said associated second scanned values, and thereby maintaining said predetermined time relationship between said first scanning sequence of said first scanned values and said second scanning sequence of said second scanned values;

switching means associated with said storage means and said interpolating means;

said switching means switching between said storage means and said interpolating means during processing of said second scanned values for producing said first scanned values;

a time-difference detecting circuit;

said time-difference detecting circuit being responsive to the time difference existing between said first scanned values of siad first scanning sequence and said associated second scanned values of said second scanning sequence;

said time-difference detecting circuit containing a first input for receiving signals indicative of said first scanning frequency;

said time-difference detecting circuit containing a second input for receiving signals indicative of said second scanning frequency;

said interpolating means contains a further storage containing pre-stored filtering coefficients;

said interpolating means further containing filtering means;

said further storage being connected to an input side of said filtering means;

said interpolating means containing a counter circuit; and said counter circuit being connected to an input side of said further storage.

14. The apparatus as defined in claim 13, wherein:

said counter circuit has a first input for receiving said signals indicative of said first scanning frequency;

said counter circuit having a second input for receiving an output signal generated by said time-difference detecting circuit; and said counter circuit having an output for storage addresses for said further storage containing said prestored filtering coefficients.

15. An apparatus for synchronizing two sequences of scanned signals, comprising:

storage means for receiving a sequence of scanned signals at a scanning frequency;

synchronizing means operatively associated with said storage means and producing from said scanning sequence of said scanned signals, a further scanning sequence of further scanned signals synchronized with said scanned signals;

said synchronizing means containing interpolating means producing said further scanned signals sychronized with said scanned signals by interpolating between the amplitudes of a predetermined number of successive ones of said scanned signals; and said interpolating means being connected in parallel with said storage means in order to restore synchronization once the time difference between said further scanned signals and said scanned singals increases to one scanning interval.

16. A method of producing a sequence of first scanned values at a first sequence of scanning times from a sequence of second scanned values at a second sequence of scanning times, comprising the steps, comprising the steps of:

delaying sid second scanned values and thereby producing said first scanned values at said first sequence of scanning times as long as said second values appear at scanning times within a predetermined time interval about said scanning times of associated ones of said first scanned values;

interpolating between amplitudes of a predetermined number of successive ones of said second scanned values of said second scanning sequence and thereby producing said first scanned values at said first sequence of scanning times if said predetermined time interval is exceeded; and repeating said delaying and interpolating steps.

* * * * *

UNITED STATES PATENT AND TRADEMARK OFFICE
CERTIFICATE OF CORRECTION

PATENT NO. : 4,780,892

DATED : October 25, 1988

INVENTOR(S) : ROGER LAGADEC

Page 1 of 3

It is certified that error appears in the above-identified patent and that said Letters Patent is hereby corrected as shown below:

Column 1, line 8, please delete "1995" and insert --1985--

Column 2, line 19, please delete "Eupean" and insert --European--

Column 4, line 51, after "approaches the" please insert --threshold value 15 or 16, the last-appearing time difference is-- and please delete "the" second occurrence Column 7, line 6, please delete "valu" and insert --value--

Column 9, line 63, please delete "comensated" and insert --compensated--

Column 10, line 58, after "scanned" please insert --amplitude--

Column 11, line 35, please delete "%" and insert --T--

Column 11, line 56, please delete "continuouslymmonitors" and insert --continuously monitors--

Column 11, line 67, please delete "muttiplier" and insert --multiplier--

Column 12, line 46, please delete "stroed" and insert --stored--

Column 13, line 16, please delete "mentined" and insert --mentioned--

Column 14, line 8, please delete "frist" and insert --first--

UNITED STATES PATENT AND TRADEMARK OFFICE
CERTIFICATE OF CORRECTION

PATENT NO. : 4,780,892

DATED : October 25, 1988

INVENTOR(S) : ROGER LAGADEC

It is certified that error appears in the above-identified patent and that said Letters Patent is hereby corrected as shown below:

Column 14, line 13, please delete "balues" and insert --values--

Column 14, line 22, please delete "intails" and insert --entails--

Column 14, line 29, please delete "difined" and insert --defined--

Column 14, line 49, please delete "second" and insert --defined--

Column 14, line 52, please delete "frist" and insert --first--

Column 15, line 32, please delete "entales" and insert --entails--

Column 15, line 39, please delete "seuqence" and insert --sequence--

Column 16, line 10, please delete "frist" and insert --first--

Column 16, line 31, please delete "frist" and insert --first--

Column 16, line 38, please delete "deifned" and insert --defined--

Column 17, line 1, please delete "alternaltey" and insert --alternately--

Column 17, line 67, please delete "siad" and insert --said--

Column 18, line 52, please delete "comprising the steps"

UNITED STATES PATENT AND TRADEMARK OFFICE
CERTIFICATE OF CORRECTION

PATENT NO. : 4,780,892

DATED : October 25, 1988

INVENTOR(S) : Roger Lagadec

Page 3 of 3

It is certified that error appears in the above-identified patent and that said Letters Patent is hereby corrected as shown below:

Column 18, line 54, please delete "sid" and insert --said--.

Signed and Sealed this

Twenty-third Day of May, 1989

Attest:

DONALD J. QUIGG

*Attesting Officer*  *Commissioner of Patents and Trademarks*